United States Patent
Suzuki et al.

(10) Patent No.: US 10,896,831 B2
(45) Date of Patent: Jan. 19, 2021

(54) FILM FORMING APPARATUS

(71) Applicants: NUFLARE TECHNOLOGY, INC., Yokohama (JP); SHOWA DENKO K.K., Tokyo-to (JP); CENTRAL RESEARCH INSTITUTE OF ELECTRIC POWER INDUSTRY, Tokyo-to (JP)

(72) Inventors: Kunihiko Suzuki, Kanagawa (JP); Naohisa Ikeya, Kanagawa (JP); Keisuke Fukada, Saitama (JP); Masahiko Ito, Kanagawa (JP); Isaho Kamata, Kanagawa (JP); Hidekazu Tsuchida, Kanagawa (JP); Hiroaki Fujibayashi, Aichi (JP); Hideyuki Uehigashi, Aichi (JP); Masami Naito, Aichi (JP); Kazukuni Hara, Aichi (JP); Hirofumi Aoki, Aichi (JP); Takahiro Kozawa, Aichi (JP)

(73) Assignees: NuFlare Technology, Inc., Yokohama (JP); Showa Denko K.K., Tokyo (JP); Central Research Institute of Electric Power Industry, Tokyo (JP)

( * ) Notice: Subject to any disclaimer, the term of this patent is extended or adjusted under 35 U.S.C. 154(b) by 208 days.

(21) Appl. No.: 16/118,734

(22) Filed: Aug. 31, 2018

(65) Prior Publication Data
US 2018/0374721 A1 Dec. 27, 2018

Related U.S. Application Data

(63) Continuation of application No. PCT/JP2017/007292, filed on Feb. 27, 2017.

(30) Foreign Application Priority Data

Mar. 1, 2016 (JP) ................. 2016-039270

(51) Int. Cl.
*C23C 16/40* (2006.01)
*H01L 21/67* (2006.01)
(Continued)

(52) U.S. Cl.
CPC ........ *H01L 21/6719* (2013.01); *C23C 16/455* (2013.01); *C23C 16/45587* (2013.01);
(Continued)

(58) Field of Classification Search
CPC ............... H01L 21/6719; H01L 21/205; H01L 21/02529; C23C 16/455; C23C 16/45587; B01F 3/028
(Continued)

(56) References Cited

U.S. PATENT DOCUMENTS 8,764,902 B2 * 7/2014 Suzuki .............. C23C 16/45565
118/715
2010/0003405 A1 * 1/2010 Kappeler ................ C30B 25/14
427/255.28

FOREIGN PATENT DOCUMENTS

DE 10 2005 055 468 A1 5/2007
JP 2000-144432 5/2000
(Continued)

OTHER PUBLICATIONS

Notice of Reasons for Refusal issued by the Japanese Patent Office dated Nov. 12, 2019, for Japanese Patent Application No. 2016-039270.
(Continued)

*Primary Examiner* — Rudy Zervigon
(74) *Attorney, Agent, or Firm* — Finnegan, Henderson, Farabow, Garrett & Dunner, L.L.P.

(57) ABSTRACT

A supply part includes a first partition, a second partition under the first partition, a third partition under the second partition, a first flow path between the first partition and the
(Continued)

second partition allowing a first gas to be introduced therein, a second flow path between the second partition and the third partition allowing a second gas to be introduced therein, a first piping extending from the second partition to reach below the third partition and being communicated with the first flow path, a second piping extending from the third partition to reach below the third partition and being communicated with the second flow path, and a convex portion provided on an outer circumferential surface of the first piping or an inner circumferential surface of the second piping protruding from one of the outer circumferential surface and the inner circumferential surface toward the other one.

10 Claims, 6 Drawing Sheets

(51) Int. Cl.
H01L 21/205 (2006.01)
C23C 16/455 (2006.01)
B01F 3/02 (2006.01)
H01L 21/02 (2006.01)
(52) U.S. Cl.
CPC ............ *H01L 21/205* (2013.01); *B01F 3/028* (2013.01); *H01L 21/02529* (2013.01)

(58) Field of Classification Search
USPC ........................................ 118/715; 156/345.1
See application file for complete search history.

(56) References Cited

FOREIGN PATENT DOCUMENTS

| JP | 2000-252270 | 9/2000 |
| JP | 2004-100001 | 4/2004 |
| JP | 2010-62383 | 3/2010 |
| JP | 2013-121885 | 6/2013 |
| JP | 2013-122066 | 6/2013 |
| JP | 2013-122067 | 6/2013 |
| JP | 2015-5658 | 1/2015 |
| JP | 2016-50164 | 4/2016 |

OTHER PUBLICATIONS

International Search Report issued in International Application No. PCT/JP2017/007292 dated Apr. 25, 2017.
Taiwanese Office Action dated Nov. 17, 2017, in Taiwanese patent application No. 106106581.
Official Action issued by the German Patent and Trademark Office dated Jul. 7, 2020, for German Application No. 11 2017 001 127.2.
Notification of Reason for Refusal issued by KIPO dated May 21, 2020, for Korean Patent Application No. 10-2018-7028294.

* cited by examiner

FILM FORMING APPARATUS

CROSS-REFERENCE TO RELATED APPLICATIONS

This is a continuation of International Application No. PCT/JP2017/007292, filed Feb. 27, 2017, which claims priority from Japanese Patent Application No. 2016-39270, filed on Mar. 1, 2016, all of which are incorporated herein by reference.

FIELD

The embodiments of the present invention relate to a film forming apparatus.

BACKGROUND

A film forming apparatus that supplies a Si source gas and a C source gas to a substrate from above the substrate to epitaxially grow a SiC film has a problem that, if the Si source gas and the C source gas are mixed before introduced into a reaction chamber, these source gases react with each other and deposits adhere on an introduction part or a wall surface, resulting in a source of particles.

In order to solve this problem, a film forming apparatus has been proposed that supplies a Si source gas and a C source gas from a plurality of separate pipings into a reaction chamber to cause these gases to be mixed in the reaction chamber.

SUMMARY

However, in the structure described above, there is a risk that the gases supplied from the separate pipings enter the pipings again and deposits adhere on introduction ports of the pipings. Accordingly, the present inventors have found out that entering of gases can be suppressed by configuring a supply piping for a source gas to have a double tube structure including an inner pipe and an outer pipe and by supplying a Si source gas and a C source gas from the inner pipe while supplying a purge gas from a space between the inner pipe and the corresponding outer pipe.

In a high-temperature process for SiC or the like, a gas supply part where the pipings are provided also reaches a high temperature. Therefore, a material having a high heat resistance, such as carbon coated with SiC, needs to be used for the pipings. However, this double tube structure requires separate structures having some play to suppress deformation due to thermal expansion. Accordingly, it is difficult to maintain positional accuracy between the inner pipe and the outer pipe. If the position is displaced and a place where the inner pipe and the outer pipe are close to each other is formed, the purge gas is not sufficiently supplied from that place, which leads to a risk that adhesion of deposits occurs. In that case, a problem that the deposits on the pipes fall as particles onto the substrate and thus deteriorate the film quality occurs.

An object of the present invention is to provide a film forming apparatus that can suppress entering of gases, suppress particles from being generated due to adhesion of deposits, and prevent occurrence of crystal defects in a formed film.

A film forming apparatus according to an embodiment of the present invention comprises a reaction chamber configured to enable a reaction on a substrate and a supply part provided above the reaction chamber and configured to supply at least a first gas and a second gas onto the substrate, wherein the supply part comprises a first partition, a second partition provided under the first partition at a predetermined interval therefrom, a third partition provided under the second partition at a predetermined interval therefrom, a first flow path provided between the first partition and the second partition to allow the first gas to be introduced therein, a second flow path provided between the second partition and the third partition to allow the second gas to be introduced therein, a first piping extending from the second partition to reach below the third partition and being communicated with the first flow path, a second piping provided to enclose the first piping, extending from the third partition to reach below the third partition, and being communicated with the second flow path, and a convex portion provided on an outer circumferential surface of the first piping or an inner circumferential surface of the second piping and protruding from one of the outer circumferential surface of the first piping and the inner circumferential surface of the second piping toward the other one.

In the film forming apparatus described above, the convex portion can be provided on the outer circumferential surface of the first piping and protrude toward the inner circumferential surface of the second piping.

In the film forming apparatus described above, the convex portion can be provided above bottom ends of the first pining and the second piping.

In the film forming apparatus described above, the convex portion can have a shape extending in a central axis direction of the first piping.

In the film forming apparatus described above, a bottom end of the convex portion can have a taper.

In the film forming apparatus described above, a dimension of the convex portion in a radial direction can be a dimension that does not bring the convex portion into contact with the inner circumferential surface of the second piping after the first piping and the second piping are deformed due to heat.

In the film forming apparatus described above, a bottom end of the first piping can be positioned at a same level as that of a bottom end of the second piping.

In the film forming apparatus described above, the convex portions as many as three or more can be provided on the outer circumferential surface of the first piping to be equally phased in a circumferential direction.

In the film forming apparatus described above, the first piping can include a bottom end portion with a tapered shape having an inside diameter increasing gradually toward below, and the second piping can have a linear shape.

In the film forming apparatus described above, the first piping and the second piping can include a bottom end portion with a tapered shape having an inside diameter increasing gradually toward below.

In the film forming apparatus described above, the convex portion can be provided in a position separated from the bottom ends of the first piping and the second piping.

According to the present invention, it is possible to suppress entering of gases, suppress particles from being generated due to adhesion of deposits, and prevent occurrence of crystal defects in a formed film.

DETAILED DESCRIPTION

Embodiments of the present invention will be described below in detail with reference to the accompanying drawings. These embodiments do not limit the present invention.

First Embodiment

Figure 1:
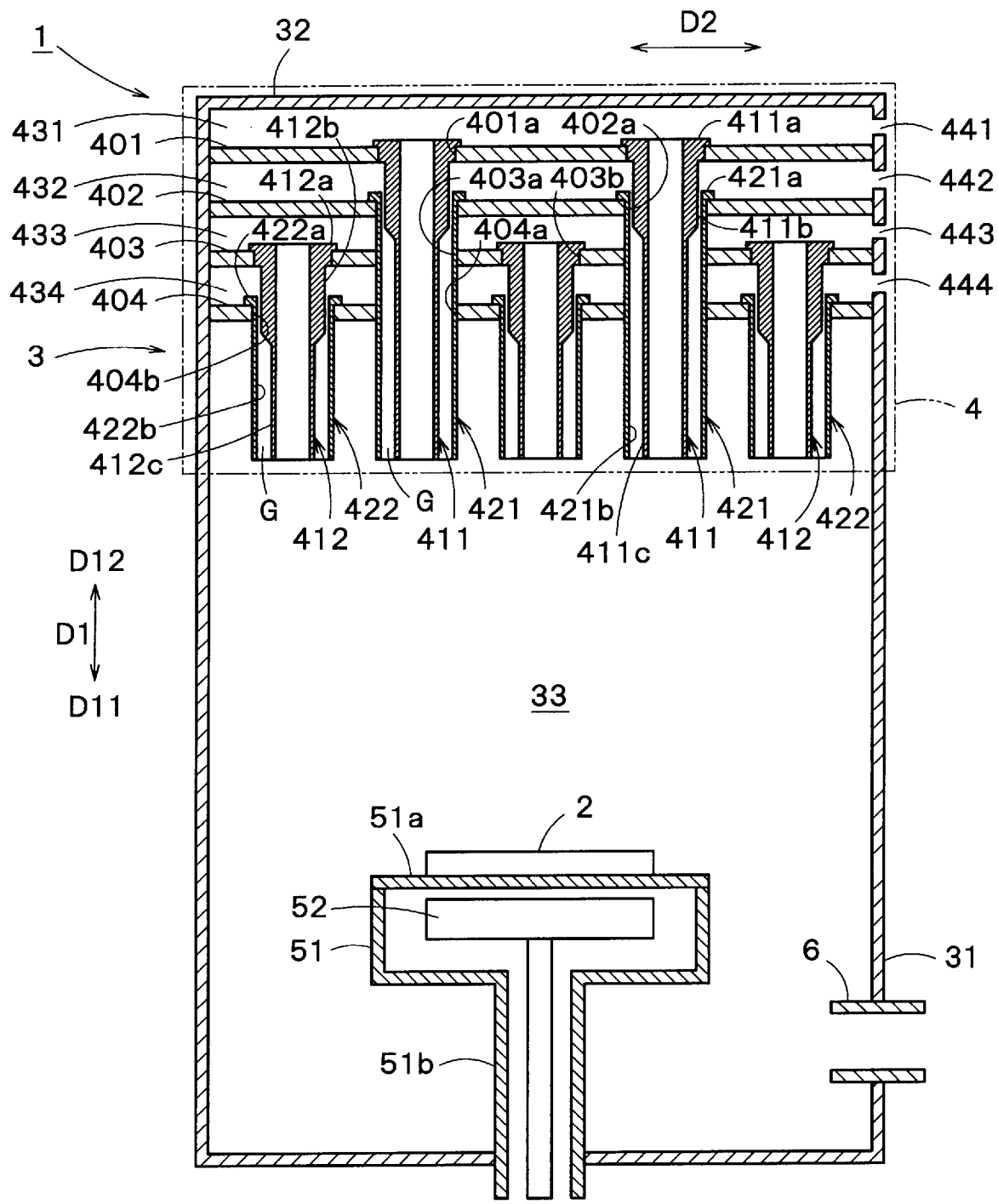
FIG. 1 is a schematic sectional view illustrating a film forming apparatus according to a first embodiment.

FIG. 1 is a schematic sectional view of a film forming apparatus 1 according to a first embodiment. The film forming apparatus 1 in FIG. 1 can be used to perform epitaxial growth of a SiC film, which is an example of film forming processing, on a SiC substrate 2 being an example of a substrate. As illustrated in FIG. 1, the film forming apparatus 1 includes a chamber 3 being an example of a film forming chamber, and a supply part 4. The film forming apparatus 1 also includes a rotating part 51 and a gas discharge part 6.

The chamber 3 is formed of metal such as SUS into a hollow shape. The chamber 3 has, for example, a substantially cylindrical shape. Epitaxial growth on the SiC substrate 2 is performed in the chamber 3 that is kept at a constant pressure or a reduced pressure.

The supply part 4 is placed in an upper portion of the chamber 3. The supply part 4 introduces source gases from an outer portion of the chamber 3 to an inner portion of the chamber 3 and supplies the introduced source gases onto the SiC substrate 2 positioned in a direction D11 of (hereinafter, "below") the supply part 4. A specific configuration of the supply part 4 will be described later.

The rotating part 51 is placed in a reaction chamber 33 under the supply part 4. The rotating part 51 is rotated while having a susceptor 51a mounted thereon. The SiC substrate 2 is mounted on the susceptor 51a. A heating mechanism 52 is placed inside the rotating part 51. The rotating part 51 is connected to a support shaft 51b of a tubular shape extending below, and the support shaft 51b is coupled to a rotating mechanism (not illustrated). With the rotating mechanism, the susceptor 51a is rotated via the rotating part 51. The heating mechanism 52 is constituted of, for example, a resistive heater. The heating mechanism 52 is connected to a wire (not illustrated) passing through the inside of the support shaft 51b. The heating mechanism 52 is fed with power from the wire to heat the SiC substrate 2 from the rear surface via the susceptor 51a.

The rotating part 51 rotates the SiC substrate 2 mounted on the susceptor 51a while heating the SiC substrate 2 with the heating mechanism 52. Source gases supplied onto the heated SiC substrate 2 cause a thermal decomposition reaction and a hydrogen reduction reaction on the surface of the SiC substrate 2 or in the vicinity thereof. Accordingly, a SiC film is epitaxially grown on the SiC substrate 2. Due to rotation of the SiC substrate 2, the growth rate of the SiC film can be uniformized in the plane of the SiC substrate 2. This can improve the uniformity (hereinafter, also "in-plane uniformity") of the film thickness of the SiC film in the plane of the SiC substrate 2.

The gas discharge part 6 is provided below the susceptor 51a, for example, on a side wall 31 of the chamber 3. The gas discharge part 6 discharges reaction by-products, unreacted gases after passing the SiC substrate 2, and the like. A vacuum suction can be performed by a pump (not illustrated) through the gas discharge part 6 and an ambient pressure in the chamber 3 can be appropriately adjusted.

(Supply Part 4)

A specific configuration example of the supply part 4 is explained next.

As illustrated in FIG. 1, the supply part 4 has a top wall 32 of the chamber 3 and first to fourth gas separating plates 401 to 404 being an example of partitions, first and second inner pipes 411 and 412 being an example of a first piping, and first and second outer pipes 421 and 422 being an example of a second piping. These constituent elements are made of, for example, carbon coated with SiC to be resistant to a high-temperature reaction process.

(Gas Separating Plates 401 to 404)

The first to fourth gas separating plates 401 to 404 are placed at predetermined intervals sequentially in this order from the top wall 32 of the chamber 3 to below. Independent gas flow paths are provided between the first to fourth gas separating plates 401 to 404 and the top wall 32 of the chamber 3, respectively.

Specifically, a first introduction path 431 being an example of a first flow path is provided between the top wall 32 of the chamber 3 being an example of a first partition and the first gas separating plate 401 being an example of a second partition. The first introduction path 431 introduces a Si-based source gas containing Si. A first introduction port 441 communicated with the first introduction path 431 is provided on the side wall 31 of the chamber 3 at an upstream end of the first introduction path 431. A gas source of the Si-based source gas (not illustrated) is connected to the first introduction port 441. A flow adjusting mechanism (not illustrated) adjusts the flow rate of the Si-based source gas supplied from the gas source to the first introduction port 441. As the Si-based source gas, for example, silane ($SiH_4$) can be used as a silane-based gas. A gas containing chlorine such as $SiH_2Cl_2$, $SiHCl_3$, or $SiCl_4$ can also be used. A gas of silane having HCl added thereto can alternatively be used as the Si-based source gas.

A second introduction path 432 being an example of a second flow path is provided between the first gas separating plate 401 and the second gas separating plate 402 being an example of a third partition. The second introduction path 432 introduces a purge gas for suppressing mixture of source gases into the chamber 3. A second introduction port 442 communicated with the second introduction path 432 is provided on the side wall 31 of the chamber 3 at an upstream end of the second introduction path 432. A gas source of the purge gas (not illustrated) is connected to the second introduction port 442. A flow adjusting mechanism (not illustrated) adjusts the flow rate of the purge gas supplied from the gas source to the second introduction port 442. For example, an inert gas, that is, a rare gas such as Ar or He as well as $H_2$ can be used as the purge gas.

A third introduction path 433 being an example of the first flow path is placed between the second gas separating plate 402 being also an example of the first partition and the third gas separating plate 403 being an example of the second partition. The third introduction path 433 introduces a C-based source gas into the chamber 3. A third introduction port 443 communicated with the third introduction path 433 is provided on the side wall 31 of the chamber 3 at an upstream end of the third introduction path 433. A gas source of the C-based source gas (not illustrated) is connected to the third introduction port 443. A flow adjusting mechanism (not illustrated) adjusts the flow rate of the C-based source gas supplied from the gas source to the third introduction port 443. For example, propane ($C_3H_8$) can be used as the C-based source gas.

A fourth introduction path 434 being an example of the second flow path is placed between the third gas separating plate 403 and the fourth gas separating plate 404 being an example of the third partition. The fourth introduction path 434 introduces a purge gas for suppressing mixture of source gases into the chamber 3. A fourth introduction port 444 communicated with the fourth introduction path 434 is placed on the side wall 31 of the chamber 3 at an upstream end of the fourth introduction path 434. A gas source of the purge gas (not illustrated) is connected to the fourth introduction port 444. A flow adjusting mechanism (not illustrated) adjusts the flow rate of the purge gas supplied from the gas source to the fourth introduction port 444.

The second introduction path 432 and the fourth introduction path 434 can introduce an impurity doping gas for controlling the conductivity type of the SiC film in addition to the purge gas. When the conductivity type of the SiC film is to be an n type, $N_2$ can be used as the impurity doping gas, for example. When the conductivity type of the SiC film is to be a p type, TMA (trimethylaluminium) can be used as the impurity doping gas, for example.

(Pipes 411, 412, 421, and 422)

The first inner pipe 411 has a substantially cylindrical shape extending in a direction D1 (hereinafter, "vertical direction"). The first inner pipe 411 is placed on the first gas separating plate 401 that separates the first introduction path 431 and the second introduction path 432 provided below D11 of the first introduction path 431 from each other. The first inner pipe 411 is communicated with the first introduction path 431 and extends from the first gas separating plate 401 to reach below the fourth gas separating plate 404. Specifically, an annular flange 411a is provided on the top end of the first inner pipe 411. Through holes 401a to 404a are provided on the first to fourth gas separating plates 401 to 404 corresponding to the first inner pipe 411, respectively. The first inner pipe 411 extends from the first gas separating plate 401 through the through holes 402a to 404a in a state where the flange 411a is caused to abut on an inner circumferential portion of the through hole 401a from a direction D12 (hereinafter, "above") and passes through the second introduction path 432, the second gas separating plate 402, the third introduction path 433, the third gas separating plate 403, and the fourth introduction path 434 to reach below the fourth gas separating plate 404.

The first outer pipe 421 has a substantially cylindrical shape extending in the vertical direction. The first outer pipe 421 is shorter than the first inner pipe 411. The inside diameter of the first outer pipe 421 is larger than the outside diameter of the first inner pipe 411. The first outer pipe 421 is placed on the second gas separating plate 402 that separates the second introduction path 432 and the third introduction path 433 from each other to enclose the first inner pipe 411. The first outer pipe 421 is communicated with the second introduction path 432 and extends from the second gas separating plate 402 to reach below the fourth gas separating plate 404. Specifically, an annular flange 421a is provided on the top end of the first outer pipe 421. The first outer pipe 421 extends from the second gas separating plate 402 through the through holes 403a and 404a in a state where the flange 421a is caused to abut on an inner circumferential portion of the through hole 402a from above and passes through the third introduction path 433, the third gas separating plate 403, and the fourth introduction path 434 to reach below the fourth gas separating plate 404. The bottom end of the first outer pipe 421 is positioned at the same level as the bottom end of the first inner pipe 411.

With this configuration, the Si-based source gas supplied from the first inner pipe 411 to below can be shielded from the vicinity by the purge gas supplied from a space between the first outer pipe 421 and the first inner pipe 411 to below. Accordingly, entering of the Si-based source gas can be suppressed.

The second inner pipe 412 has a substantially cylindrical shape extending in the vertical direction. The second inner pipe 412 is shorter than the first outer pipe 421. The second inner pipe 412 is placed on the third gas separating plate 403 that separates the third introduction path 433 and the fourth introduction path 434 provided below the third introduction path 433 from each other. The second inner pipe 412 is communicated with the third introduction path 433 and extends from the third gas separating plate 403 to reach below the fourth gas separating plate 404. Specifically, an annular flange 412a is provided on the top end of the second inner pipe 412. Through holes 403b and 404b are provided on the third and fourth gas separating plates 403 and 404 corresponding to the second inner pipe 412, respectively. The second inner pipe 412 extends from the third gas separating plate 403 through the through hole 404b in a state where the flange 412a is caused to abut on an inner circumferential portion of the through hole 403b from above and passes through the fourth introduction path 434 to reach below the fourth gas separating plate 404. The bottom end of the second inner pipe 412 is positioned at the same level as the bottom end of the first inner pipe 411.

The second outer pipe 422 has a substantially cylindrical shape extending in the vertical direction. The second outer pipe 422 is shorter than the second inner pipe 412. The inside diameter of the second outer pipe 422 is larger than the outside diameter of the second inner pipe 412. The second outer pipe 422 is placed on the fourth gas separating plate 404 that separates the fourth introduction path 434 and the reaction chamber 33 provided below the fourth introduction path 434 from each other to enclose the second inner pipe 412. The second outer pipe 422 is communicated with the fourth introduction path 434 and reaches below the fourth gas separating plate 404. Specifically, an annular flange 422a is provided on the top end of the second outer pipe 422. The second outer pipe 422 is provided to position the bottom end thereof at a same level as that of the bottom end of the first inner pipe 411 in a state where the flange 422a is caused to abut on an inner circumferential portion of the through hole 404b from above.

With this configuration, the C-based source gas supplied from the second inner pipe 412 to below can be shielded from the vicinity by the purge gas supplied from a space between the second outer pipe 422 and the second inner pipe 412 to below. Accordingly, entering of the C-based source gas can be suppressed.

Pairs of the first inner pipe 411 and the first outer pipe 421 and pairs of the second inner pipe 412 and the second outer pipe 422 are placed at appropriate intervals in a direction D2 (hereinafter, "horizontal direction").

(Guide Parts 411b and 412b)

Figure 2A:
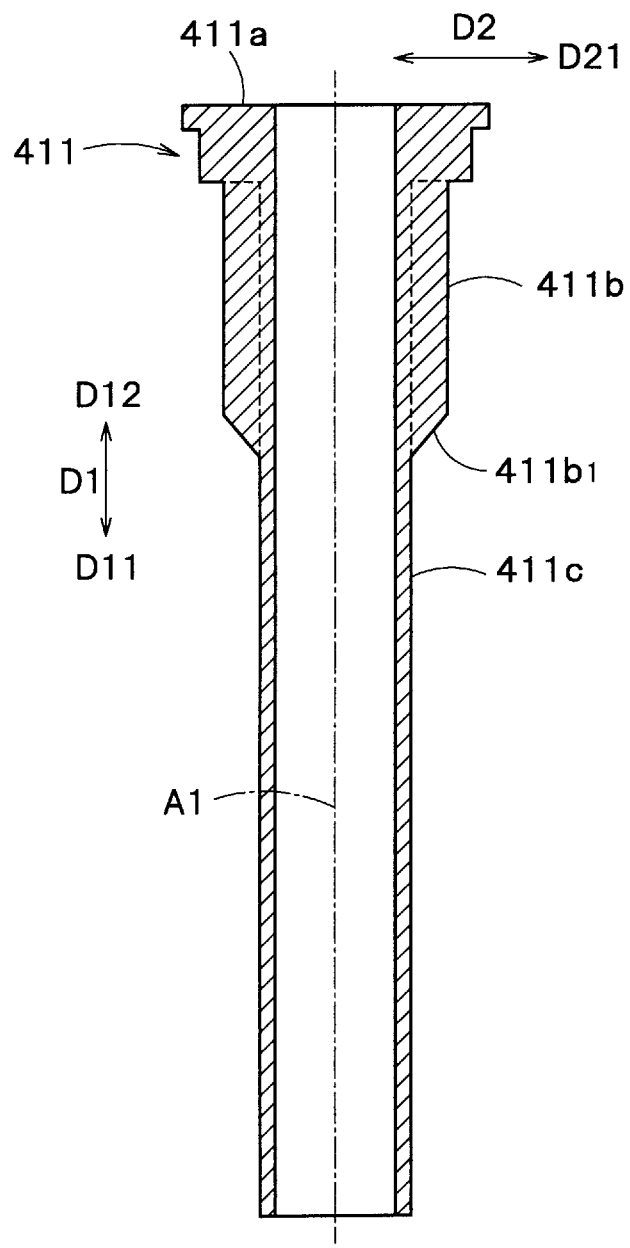
FIG. 2A is a sectional view of a first inner pipe according to the first embodiment.
Figure 2B:
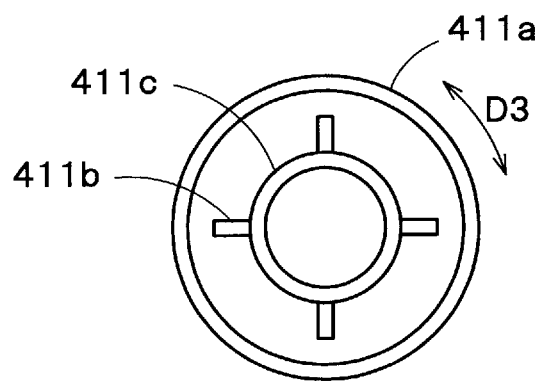
FIG. 2B is a bottom surface view of the first inner pipe illustrated in FIG. 2A.

FIG. 2A is a sectional view of the first inner pipe 411 according to the first embodiment and FIG. 2B is a bottom surface view of the first inner pipe 411 illustrated in FIG. 2A.

When the supply part 4 is to be assembled, the first outer pipe 421 is installed on the second gas separating plate 402 and thereafter the first inner pipe 411 is installed on the first gas separating plate 401. At this time, the first inner pipe 411 is inserted into the first outer pipe 421. In order to guide insertion and positioning of the first inner pipe 411 with respect to the first outer pipe 421, first guide parts 411b illustrated in FIGS. 1, 2A, and 2B are provided.

The first guide parts 411b are provided on an outer circumferential surface 411c of the first inner pipe 411 and protrude from the outer circumferential surface 411c toward an inner circumferential surface 421b of the first outer pipe 421. That is, as illustrated in FIG. 2A, the first guide parts 411b protrude in a direction D21 (hereinafter, "radially outward") of the first inner pipe 411. Because the first guide parts 411b are provided on the first inner pipe 411, the first guide parts 411b can be formed more easily than in a case where the first guide parts 411b are provided on the first outer pipe 421.

The first guide parts 411b each have a fin shape extending in the vertical direction being a central axis direction of the first inner pipe 411. This can suppress the first guide parts 411b from blocking the flow of the Si-based source gas. A member having a rectangular cross section in the radial direction can be used as the first guide parts 411b as illustrated in FIG. 2B. The cross section of the first guide parts 411b in the radial direction can have a triangular shape or a shape where the radially outward end is rounded.

The first guide parts 411b are provided above the bottom ends of the first inner pipe 411 and the first outer pipe 421. Accordingly, the first guide parts 411b can be placed at a position distant from the reaction space 33 provided below the supply part 4 and thus generation of deposits on the first guide parts 411b due to the source gas can be suppressed.

As illustrated in FIG. 2A, a bottom end $411b_1$ of the first guide part 411b has a taper on a radially outer side. Accordingly, the first inner pipe 411 can be inserted into the first outer pipe 421 easily.

In the example illustrated in FIG. 2B, the first guide parts 411b are placed at four positions equally phased in a direction D3 (a circumferential direction) on the outer circumferential surface 411c of the first inner pipe 411, respectively. It is necessary to provide a plurality of the first guide parts 411b. The first guide parts 411b are preferably provided at three or more positions substantially equally phased and can alternatively be provided at five or more positions as long as the first guide parts 411b do not block the flow of the Si-based source gas. Provision of the first guide parts 411b at three or more positions enables the first inner pipe 411 to secure a gap G (see FIG. 1) between the first inner pipe 411 and the first outer pipe 421 in all directions.

It is desirable that the first guide parts 411b have such a dimension in the radial direction that does not bring the first guide parts 411b into contact with the inner circumferential surface 421b of the first outer pipe 421 after the first inner pipe 411 and the first outer pipe 421 are deformed due to heat of the heater during film formation.

With the first guide parts 411b, insertion and positioning of the first inner pipe 411 with respect to the first outer pipe 421 are guided to enable a central axis A1 of the first inner pipe 411 to be almost aligned with a central axis of the first outer pipe 421. That is, with the first guide parts 411b, positional accuracy of the first inner pipe 411 can be improved. Accordingly, the gap G can be secured between the first inner pipe 411 and the first outer pipe 421. Because the gap G is secured, contact between the first inner pipe 411 and the first outer pipe 421 during assembly can be avoided.

Figure 3:
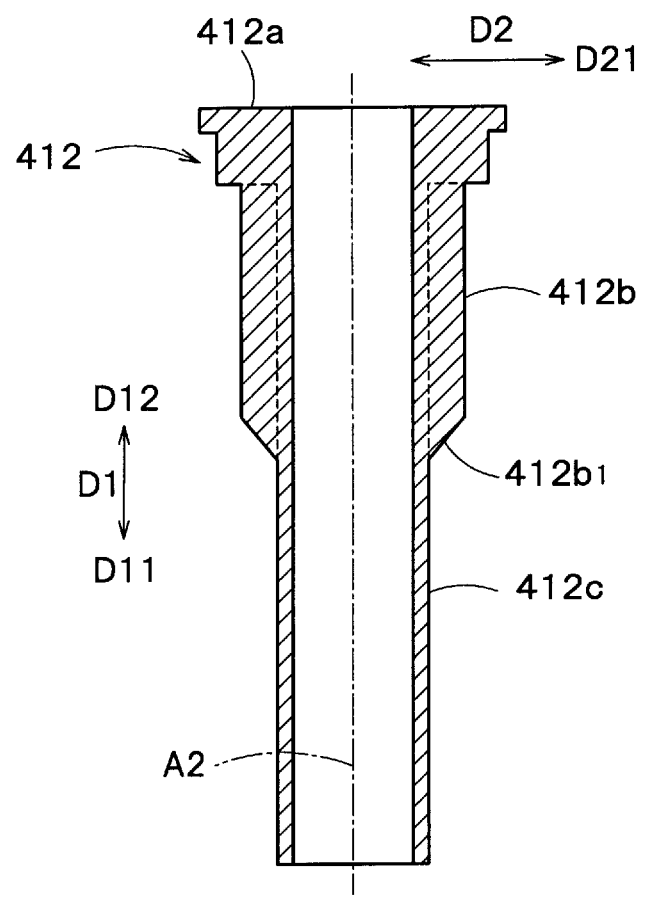
FIG. 3 is a sectional view of a second inner pipe according to the first embodiment.

FIG. 3 is a sectional view of the second inner pipe 412 according to the first embodiment.

When the supply part 4 is to be assembled, the second outer pipe 422 is installed on the fourth gas separating plate 404 provided below the third gas separating plate 403 and thereafter the second inner pipe 412 is installed on the third gas separating plate 403. At this time, the second inner pipe 412 is inserted into the second outer pipe 422. In order to guide insertion and positioning of the second inner pipe 412 with respect to the second outer pipe 422, second guide parts 412b illustrated in FIGS. 1 and 3 are provided.

The second guide parts 412b are an example of a convex portion protruding from one of the second inner pipe 412 and the second outer pipe 422 toward the other one.

The second guide parts 412b are provided on an outer circumferential surface 412c of the second inner pipe 412 and protrude from the outer circumferential surface 412c toward an inner circumferential surface 422b of the second outer pipe 422. Because the second guide parts 412b are provided on the second inner pipe 412, the second guide parts 412b can be formed more easily than in a case where the second guide parts 412b are provided on the second outer pipe 422.

Furthermore, the second guide parts 412b each have a fin shape extending in the vertical direction being a central axis direction of the second inner pipe 412. This can suppress the second guide parts 412b from blocking the flow of the C-based source gas. A cross section of the second guide parts 412b in the radial direction can have an identical shape to that of the first guide parts 411b.

The second guide parts 412b are provided above the bottom ends of the second inner pipe 412 and the second outer pipe 422. Accordingly, the second guide parts 412b can be placed at a position distant from the reaction space 33 provided below the supply part 4 and thus generation of deposits on the second guide parts 412b due to the source gas can be suppressed.

As illustrated in FIG. 3, a bottom end $412b_1$ of the second guide part 412b has a taper on a radially outer side. This enables the second inner pipe 412 to be easily inserted into the second outer pipe 422.

The second guide parts 412b are placed at four positions equally spaced in the circumferential direction of the outer circumferential surface 412c of the second inner pipe 412, respectively, similarly to the first guide parts 411b. The number of the second guide parts 412b can be three, or can be five or more as long as the flow of the C-based source gas is not blocked. Due to provision of the three or more second guide parts 412b, the second inner pipe 412 can secure the gap G between the second inner pipe 412 and the second outer pipe 422 in all directions.

It is desirable that the second guide parts 412b have such a dimension in the radial direction that does not bring the second guide parts 412b into contact with the inner circumferential surface 422b of the second outer pipe 422 also after the second inner pipe 412 and the second outer pipe 422 are deformed due to heat.

With the second guide parts 412b, insertion and positioning of the second inner pipe 412 with respect to the second outer pipe 422 are guided to enable a central axis A2 of the second inner pipe 412 to be almost aligned with a central axis of the second outer pipe 422. That is, with the second guide parts 412b, positional accuracy of the second inner pipe 412 can be improved. Accordingly, the gap G can be secured between the second inner pipe 412 and the second outer pipe 422. Because the gap G is secured, contact between the second inner pipe 412 and the second outer pipe 422 during assembly can be avoided.

The first guide parts 411b and the second guide parts 412b can protrude from the inner circumferential surfaces of the relevant outer pipes toward the outer circumferential surfaces of the corresponding inner pipes, respectively. Also in this case, identical effects can be provided.

In FIG. 1, each of the pipes 411, 412, 421, and 422 is placed in plural. The numbers of the pipes 411, 412, 421, and 422 illustrated in FIG. 1 are only exemplary and are not limited thereto. Practically, more pipes 411, 412, 421, and 422 than those illustrated in FIG. 1 can be placed. Furthermore, the pipes 411, 412, 421, and 422 can be placed at intervals also in the circumferential direction of the gas separating plates 401 to 404 as well as in the radial direction.

(Film Forming Method)

A film forming method of a SiC film is explained next as an operation example of the film forming apparatus 1 according to the first embodiment configured as described above.

First, the SiC substrate 2 composed of n-type or p-type SiC single crystal is mounted on the susceptor 51a and the inside of the reaction chamber 33 is vacuum-sucked through the gas discharge part 6 to obtain a desired pressure. The heating mechanism 52 is caused to generate heat to heat the SiC substrate 2 to, for example, around 1600° C. The rotating mechanism rotates the susceptor 51a and the SiC substrate 2 via the rotating part 51 to uniformize a temperature distribution in the plane of the SiC substrate 2 without being affected by a heat generation distribution in the circumferential direction of the heating mechanism 52.

Next, a Si-based source gas, a purge gas, and a C-based source gas are introduced into the chamber 3 through the first to fourth introduction ports 441 to 444. The respective gases are introduced into the reaction chamber 33 through the first to fourth introduction paths 431 to 434 and then are supplied onto the SiC substrate 2 through the pipes 411, 412, 421, and 422.

At this time, the Si-based source gas supplied from the first inner pipes 411 is shielded by the purge gas supplied from the corresponding first outer pipes 421. Due to the shielding, entering of the Si-based source gas is suppressed. Accordingly, a reaction between the Si-based source gas and the C-based source gas before reaching onto the SiC substrate 2 can be suppressed. Furthermore, the C-based source gas supplied from the second inner pipes 412 is shielded by the purge gas supplied from the corresponding second outer pipes 422. Due to the shielding, entering of the C-based source gas is suppressed. Accordingly, a reaction between the Si-based source gas and the C-based source gas before reaching onto the SiC substrate 2 can be suppressed more.

With the source gases supplied onto the SiC substrate 2, a SiC film is epitaxially grown on the surface of the SiC substrate 2.

As described above, the gas separating plates 401 to 404, the inner pipes 411 and 412, and the outer pipes 421 and 422 are made of, for example, carbon coated with SiC to be resistant to a high-temperature reaction process. Because SiC and carbon are different in the thermal expansion rate, deformation such as warp may occur on the gas separating plates 401 to 404, the inner pipes 411 and 412, and the outer pipes 421 and 422 at the time of manufacturing these members. Therefore, it is difficult to secure processing accuracy of the gas separating plates 401 to 404, the inner pipes 411 and 412, and the outer pipes 421 and 422. Accordingly, it is also difficult to secure the positional accuracy of the pipes 411, 412, 421, and 422 when the inner pipes 411 and 412 and the outer pipes 421 and 422 are attached to the gas separating plates 401 to 404. Furthermore, because the gas separating plates 401 to 404, the inner pipes 411 and 412, and the outer pipes 421 and 422 are further deformed due to heat at the time of a reaction, it is more difficult to secure the positional accuracy of the pipes 411, 412, 421, and 422.

In a case where the guide parts 411b and 412b are not provided, it is difficult to secure the positional accuracy of the pipes 411, 412, 421, and 422 and thus there is a possibility that the central axes A1 and A2 of the inner pipes 411 and 412 are largely misaligned from the central axes of the corresponding outer pipes 421 and 422. Accordingly, the inner pipes 411 and 412 and the corresponding outer pipes 421 and 422 may be in contact with each other. When deposits due to the source gases are generated on contact positions between the inner pipes 411 and 412 and the corresponding outer pipes 421 and 422, there is a risk that the inner pipes 411 and 412 and the outer pipes 421 and 422 are fixed to each other by the deposits. If the inner pipes 411 and 412 and the outer pipes 421 and 422 are fixed to each other, the sectional areas of the flow paths of the outer pipes 421 and 422 become non-uniform and thus it becomes difficult to supply the purge gas at a uniform flow rate. Therefore, the purge gas does not appropriately function as a mixture suppressing gas and deposits are likely to be generated on the inner pipes 411 and 412 and the outer pipes 421 and 422 due to entering of the Si-based source gas or the C-based source gas at outlets of the pipes 411, 412, 421, and 422. The deposits on the pipes 411, 412, 421, and 422 then fall as particles on the SiC substrate 2 and cause crystal defects in a SiC film.

In contrast thereto, in the first embodiment, the positioning of the central axes A1 and A2 of the inner pipes 411 and 412 can be guided by the guide parts 411b and 412b when the inner pipes 411 and 412 are inserted into the outer pipes 421 and 422, respectively. Because the positioning can be guided, the central axes A1 and A2 of the inner pipes 411 and 412 can be almost aligned with the central axes of the outer pipes 421 and 422, respectively. Because the central axes can be aligned with each other, the gap G can be secured between the inner pipes 411 and 412 and the corresponding outer pipes 421 and 422. Because the gap G can be secured, contact between the inner pipes 411 and 412 and the outer pipes 421 and 422 can be avoided. Therefore, generation of deposits at the contact positions between the inner pipes 411 and 412 and the corresponding outer pipes 421 and 422 can be prevented and crystal defects in a SiC film caused by the deposits can be avoided.

As described above, according to the first embodiment, contact between the inner pipes 411 and 412 and the corresponding outer pipes 421 and 422 can be prevented by the guide parts 411b and 412b, respectively. Therefore, generation of deposits at the contact positions between the inner pipes 411 and 412 and the corresponding outer pipes 421 and 422 due to entering of the gases can be prevented. This enables occurrence of crystal defects resulting from the deposits to be prevented.

Second Embodiment

An embodiment in which bottom end portions of the inner pipes 411 and 412 have a tapered shape is explained next as a second embodiment. In the second embodiment, constituent parts corresponding to those in the above embodiment are denoted by like reference characters and redundant descriptions thereof are omitted.

Figure 4:
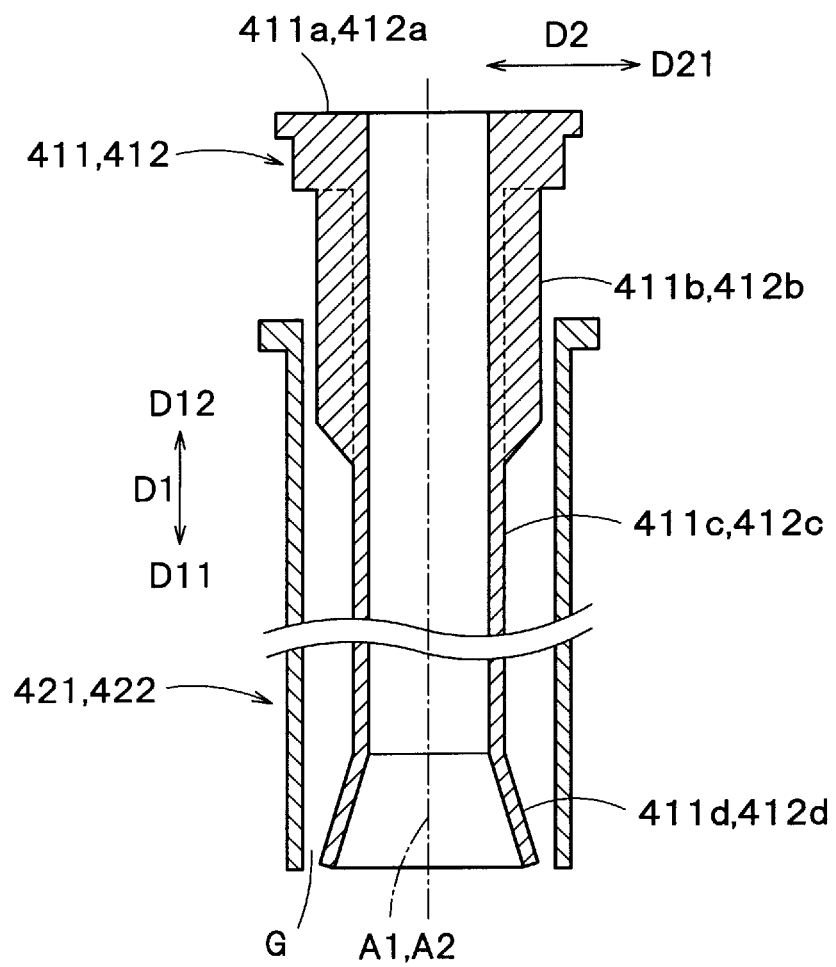
FIG. 4 is a sectional view of a pipe with a double tube structure according to a second embodiment.

FIG. 4 is a sectional view of a pipe with a double tube structure according to the second embodiment. As illustrated in FIG. 4, the inner pipes 411 and 412 of the second embodiment have bottom end portions 411d and 412d with a tapered shape, respectively. Meanwhile, the outer pipes 421 and 422 have a linear shape without having a taper similarly in the first embodiment. The tapered shape of the bottom end portions 411d and 412d is a shape where the inside diameters of the bottom end portions 411d and 412d, that is, the sectional areas of the gas flow paths increase gradually toward a downstream side of the source gas, that is, toward below D11.

In the second embodiment, with the bottom end portion 411d of the first inner pipe 411 having the tapered shape, the Si-based source gas can be ejected from the first inner pipe 411 so as to be spread slightly outward in the radial direction. A flow of radially outward components of the Si-based source gas is against a flow of the C-based source gas being about to enter the first inner pipe 411 from radially outward. Therefore, entering of the C-based source gas into the first inner pipe 411 can be suppressed. This can suppress mixture of the Si-based source gas and the C-based source gas at the bottom end portion 411d of the first inner pipe 411 to suppress generation of deposits on the first inner pipe 411.

Similarly, in the second embodiment, with the bottom end portion 412d of the second inner pipe 412 having the tapered shape, the C-based source gas can be ejected from the second inner pipe 412 so as to be spread slightly outward in the radial direction. A flow of radially outward components of the C-based source gas is against a flow of the Si-based source gas being about to enter the second inner pipe 412 from radially outward. Therefore, entering of the Si-based source gas into the second inner pipe 412 can be suppressed. Accordingly, mixture of the Si-based source gas and the C-based source gas at the bottom end portion 412d of the second inner pipe 412 can be suppressed to suppress generation of deposits on the second inner pipe 412.

Because the bottom end portions 411d and 412d have a tapered shape, the gaps between the inner pipes 411 and 412 and the corresponding outer pipes 421 and 422 at the bottom ends are narrower than those in the first embodiment. That is, the inner pipes 411 and 412 and the corresponding outer pipes 421 and 422 are more likely to be in contact with each other than those in the first embodiment.

However, because the guide parts 411b and 412b are provided in the second embodiment similarly in the first embodiment, the gaps can be secured between the inner pipes 411 and 412 and the corresponding outer pipes 421 and 422 also at the bottom ends, respectively.

Therefore, according to the second embodiment, generation of deposits on the pipes 411, 412, 421, and 422 can be suppressed effectively similarly in the first embodiment.

Third Embodiment

An embodiment in which the bottom end portions of both the inner pipes 411 and 412 and the corresponding outer pipes 421 and 422 have a tapered shape is explained next as a third embodiment. In the third embodiment, constituent parts corresponding to those in the above embodiments are denoted by like reference characters and redundant descriptions thereof are omitted.

Figure 5:
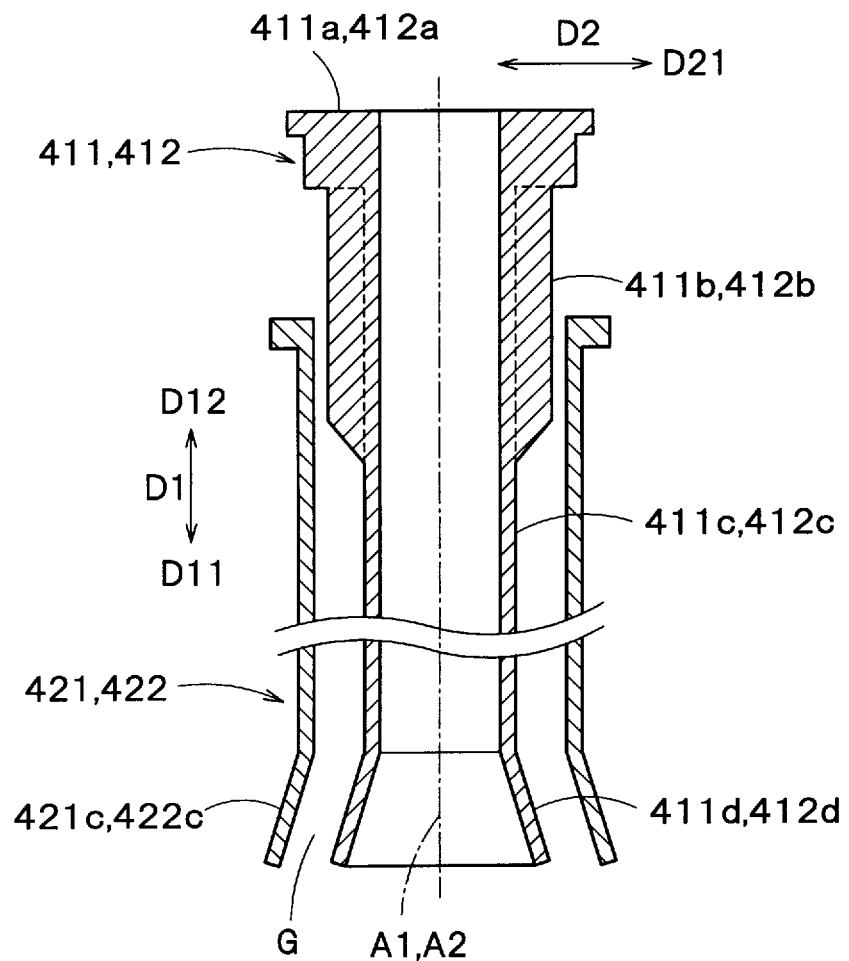
FIG. 5 is a sectional view of a pipe with a double tube structure according to a third embodiment.

FIG. 5 is a sectional view of a pipe with a double tube structure according to the third embodiment. In the third embodiment, as illustrated in FIG. 5, the outer pipes 421 and 422 also have bottom end portions 421c and 422c with a tapered shape where the inside diameter increases gradually toward below, respectively, in addition to the configuration described in the second embodiment.

Taper angles of the bottom end portions 421c and 422c of the outer pipes 421 and 422 are, for example, equal to taper angles of the bottom end portions 411d and 412d of the inner pipes 411 and 412, respectively. The taper angles of the bottom end portions 421c and 422c of the outer pipes 421 and 422 can be different from the taper angles of the bottom end portions 411d and 412d of the inner pipes 411 and 412, respectively.

In the third embodiment, because the bottom end portions 411d and 412d of the inner pipes 411 and 412 and the bottom end portions 421c and 422c of the corresponding outer pipes 421 and 422 both have a tapered shape, the ejection direction of the source gases and the ejection direction of the purge gas can be matched. Accordingly, generation of a disturbed flow can be suppressed to appropriately supply the source gases onto the SiC substrate 2.

Fourth Embodiment

An embodiment having a pipe with a triple tube structure is explained next as a fourth embodiment. In the fourth embodiment, constituent parts corresponding to those in the above embodiments are denoted by like reference characters and redundant descriptions thereof are omitted.

Figure 6:
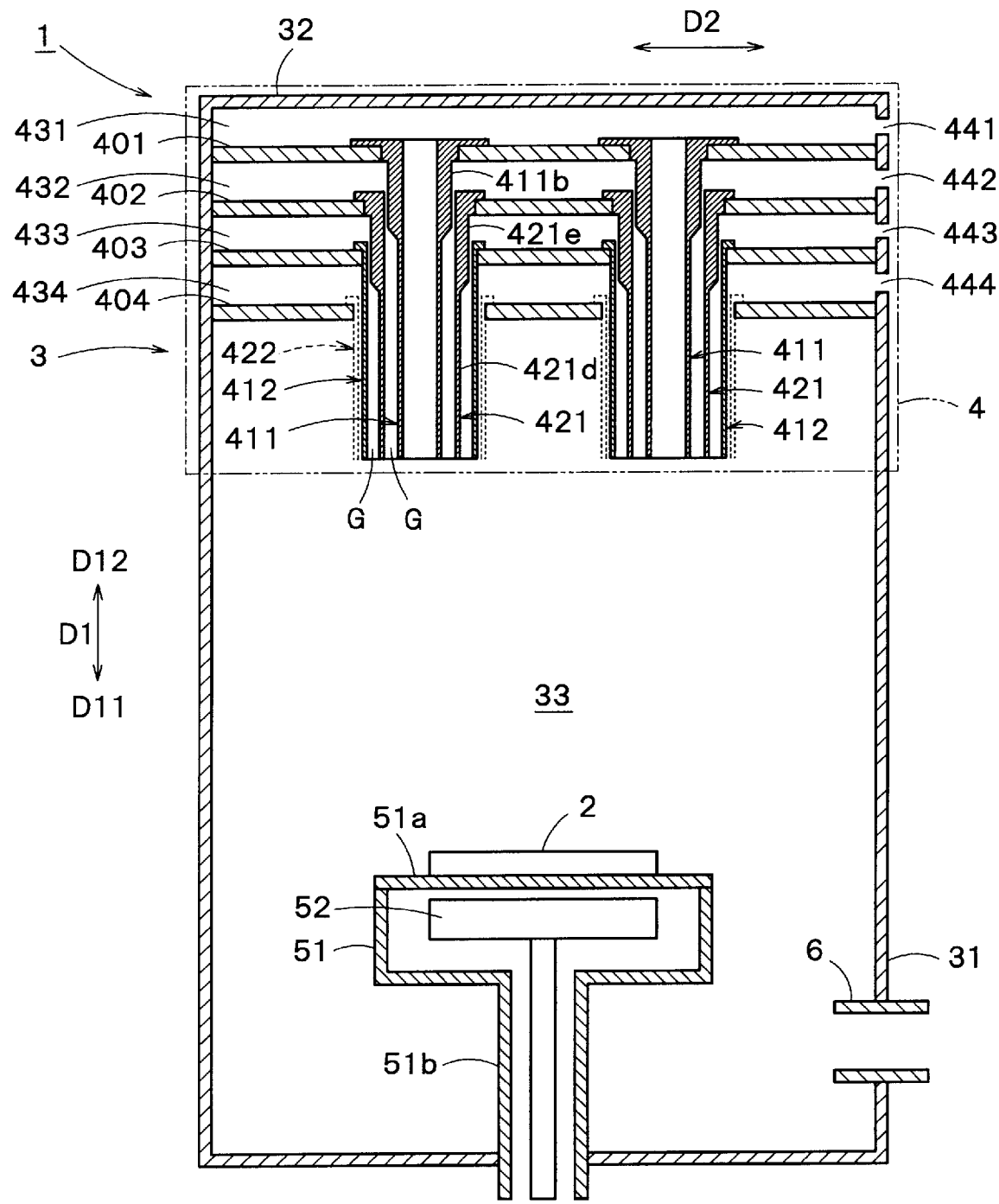
FIG. 6 is a schematic sectional view illustrating a film forming apparatus according to a fourth embodiment.

FIG. 6 is a schematic sectional view illustrating the film forming apparatus 1 according to the fourth embodiment. As illustrated in FIG. 6, the supply part 4 in the fourth embodiment has pipes with a triple tube structure in which the second inner pipe 412 explained in the embodiments described above encloses the first outer pipe 421. In the following descriptions, the first outer pipe 421 is referred to as "middle pipe 421" and the second inner pipe 412 is referred to as "outer pipe 412".

As illustrated in FIG. 6, third guide parts 421e protruding toward the outer pipe 412 are provided on an outer circumferential surface 421d of the middle pipe 421 in the fourth embodiment.

In the fourth embodiment, contact between the first inner pipe 411 and the middle pipe 421 can be avoided by the first guide parts 411b and contact between the middle pipe 421 and the outer pipe 412 can be avoided by the third guide parts 421e.

Therefore, according to the fourth embodiment, generation of deposits on the pipes 411, 412, and 421 can be suppressed similarly in the first to third embodiments.

As indicated by broken lines in FIG. 6, pipes with a quadruple tube structure in which the second outer pipe 422 explained in the first to third embodiments encloses the outer pipe 412 can alternatively be adopted. In this case, it suffices to provide guide parts (not illustrated) protruding toward the inner circumferential surface of the pipe 422 on the outer circumferential surface of the pipe 412, for example.

In the embodiments described above, the guide parts 411b with a fin shape are adopted as an example of the convex portion. The convex portion is not limited to that with a fin shape as long as the convex portion has a mode that can secure the gap G between the inner pipes 411 and 412 and the corresponding outer pipes 421 and 422. For example, the convex portion can be a columnar member protruding radially outward from the inner pipes 411 and 412.

Furthermore, the guide part can be placed in plural at intervals in the vertical direction.

In order to increase the thermal efficiency, an annular reflector can be provided on an upper portion of the chamber 3, which reflects radiation from a heat source provided below. In this case, the pipes 411, 412, 421, and 422 are placed to pass through the reflector. An auxiliary heater can be provided on the side wall 31 of the chamber 3 between the supply part 4 and the rotating part 51.

The embodiments described above are presented for purposes of illustration only and are not intended to limit the scope of the invention. These embodiments can be also carried out in other various modes, and various types of omissions, replacements, and modifications can be made without departing from the spirit of the invention. These embodiments and modifications thereof are included in the spirit and scope of the invention, and are also included in the invention described in the appended claims and equivalents thereof.

The invention claimed is:

1. A film forming apparatus comprising:
a reaction chamber configured to enable a reaction on a substrate; and
a supply part placed above the reaction chamber and configured to supply at least a first gas and a second gas onto the substrate, wherein
the supply part comprises
a first partition,
a second partition provided under the first partition at a predetermined interval therefrom,
a third partition provided under the second partition at a predetermined interval therefrom,
a first flow path provided between the first partition and the second partition to allow the first gas to be introduced therein,
a second flow path provided between the second partition and the third partition to allow the second gas to be introduced therein;
a first piping extending from the second partition to reach below the third partition and being communicated with the first flow path,
a second piping provided to enclose the first piping, extending from the third partition to reach below the third partition, and being communicated with the second flow path, and
a convex portion provided on an outer circumferential surface of the first piping or an inner circumferential surface of the second piping and protruding from one of the outer circumferential surface of the first piping and the inner circumferential surface of the second piping toward the other one,
wherein a bottom end of the convex portion is provided in a position separated upward from bottom ends of the first piping and the second piping.

2. The apparatus of claim 1, wherein the convex portion is provided on the outer circumferential surface of the first piping and protrudes toward the inner circumferential surface of the second piping.

3. The apparatus of claim 1, wherein the convex portion is provided above bottom ends of the first piping and the second piping.

4. The apparatus of claim 1, wherein the convex portion has a shape extending in a central axis direction of the first piping.

5. The apparatus of claim 4, wherein a bottom end of the convex portion has a taper.

6. The apparatus of claim 2, wherein a dimension of the convex portion in a radial direction is a dimension that does not bring the convex portion into contact with the inner circumferential surface of the second piping after the first piping and the second piping are deformed due to heat.

7. The apparatus of claim 1, wherein a bottom end of the first piping is positioned at a same level as that of a bottom end of the second piping.

8. The apparatus of claim 1, wherein convex portions as many as three or more are provided on the outer circumferential surface of the first piping to be equally phased in a circumferential direction.

9. The apparatus of claim 1, wherein the first piping includes a bottom end portion with a tapered shape having an inside diameter increasing gradually toward below, and the second piping has a linear shape.

10. The apparatus of claim 1, wherein the first piping and the second piping include a bottom end portion with a tapered shape having an inside diameter increasing gradually toward below.

* * * * *